(12) United States Patent
Nara

(10) Patent No.: US 6,342,943 B1
(45) Date of Patent: *Jan. 29, 2002

(54) EXPOSURE APPARATUS

(75) Inventor: Kei Nara, Yokohama (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/088,571

(22) Filed: Jun. 2, 1998

(30) Foreign Application Priority Data

Jun. 3, 1997 (JP) .............................................. 9-160621

(51) Int. Cl.⁷ .......................... G03B 27/54; G03B 27/42

(52) U.S. Cl. .......................................... 355/67; 355/53

(58) Field of Search .............................. 355/50, 53, 67, 355/68, 77; 250/548, 492.2, 492.22; 356/399, 400, 401

(56) References Cited

U.S. PATENT DOCUMENTS

| | | | | |
|---|---|---|---|---|
| 4,855,792 A | | 8/1989 | Holbrook et al. | 355/53 |
| RE33,836 E | | 3/1992 | Resor, III et al. | 355/43 |
| 5,521,036 A | * | 5/1996 | Iwamoto et al. | 430/22 |
| 5,617,211 A | * | 4/1997 | Nara et al. | 356/401 |
| 5,625,436 A | * | 4/1997 | Yanagihara et al. | 355/53 |
| 5,729,331 A | * | 3/1998 | Tanaka et al. | 355/53 |
| 5,844,247 A | * | 12/1998 | Nishi | 250/548 |
| 5,912,726 A | * | 6/1999 | Toguchi et al. | 355/53 |

\* cited by examiner

Primary Examiner—Russell Adams
Assistant Examiner—Hung Henry Nguyen
(74) Attorney, Agent, or Firm—Erik B. Cherdak & Associates, LLC

(57) ABSTRACT

An exposure apparatus and methods for making and using the same. The exposure apparatus includes at least one projection optical system which projects illuminating light, a substrate stage which supports a substrate to be exposed by the illuminating light and which includes a first plurality of reference marks. The exposure apparatus also includes a mask stage which supports a mask that includes a mask pattern to be projected onto the substrate by at least one projection optical system. The mask further includes a second plurality of reference marks intended to correspond to the first plurality of reference marks. The second plurality of reference marks is integrally formed with the mask pattern. The projection optical system(s) project illuminating light based on the mask pattern and the second plurality of reference marks to produce a projected image corresponding to the mask pattern and a plurality of projected images corresponding to the second plurality of reference marks. The exposure apparatus also includes an adjustment mechanism which adjusts the position of the projected image on the substrate based on a plurality of positional relationships between the plurality of projected images and the first plurality of reference marks. Also included is a plurality of sensors which detect the positional relationships, and a control device which controls the adjustment mechanism based on the positional relationships to effect a predetermined plurality of positional relationships between the plurality of projected images and the first plurality of reference marks.

22 Claims, 13 Drawing Sheets

EXPOSURE APPARATUS

BACKGROUND OF THE INVENTION

1. Field of the Invention

The present invention relates to industrial image exposure devices that are used in lithographic processes to expose images onto substrates such as during the manufacture of liquid crystal display panels, semiconductor elements, etc.

2. Description of the Related Art

Industrial imaging devices such as image exposure devices are used to produce liquid crystal display panels, semiconductor elements, etc. For example, personal computers, laptop computers, word processors, televisions, and many other common devices include components that are manufactured, in part, by using image exposure devices. The manufacture of liquid crystal display panels, for example, has become increasingly reliant on image exposure devices and techniques. And, as such display panels have become more complex and intricate, so too have the manufacturing devices and processes associated with production of the same.

Liquid crystal display (LCD) panels often are produced, in part, by forming a conductive thin film electrode (e.g., of the Indium Tin Oxide (ITO) variety, etc.) on and affixing a liquid crystal molecular orientation element to a glass substrate and sealing that arrangement with a sealant or sealing member at the outer periphery of the substrate. Formation of ITO-type thin film electrodes and, in particular, complex LCD display segments have been achieved by imaging the same via lithographic image exposure devices and processes.

To perform such lithographic processes, a photolithographic image exposure device known as a "stepper" often is used. With a stepper, a desired pattern contained in a mask or on a reticle may be projected onto a substrate via a "step and repeat" exposure method. Depending on the nature of the pattern to be exposed (e.g., the number and complexity of the display units to be exposed, etc.), other patterning devices and techniques have been used (e.g., scanning exposure devices using mirror projection aligners and systems, etc.).

Despite their widespread use to produce LCDs, etc., stepper throughput efficiency has become problematic. That is, as LCD elements have increased in complexity, the number of devices that can be made via step and repeat techniques has decreased. And, when using mirror projection type systems, etc., problems also have been realized in terms of manufacturing relatively large mirrors and assemblies to expose enlarged masks. As such, mirror-type systems have resulted in relatively large scanning devices and stepper units.

To address efficiency and size problems associated with prior stepper units, some have proposed scanning type exposure devices for relatively large circuit pattern masks. One such device is disclosed in Japanese Laid-Open Patent Publication Hei 7-57986 (U.S. Pat. No. 5,729,331). Such a scanning type exposure device uses plural projection optical systems to simultaneously scan a mask and a photosensitive substrate. As such, scanning type exposure devices of the type disclosed in the aforementioned Japanese patent publication have led to increased device throughput efficiency and decreased stepper size.

An exemplary scanning type exposure device (of the type illustrated in the aforementioned Japanese patent publication) is shown in drawing figure (FIG.) 1, which is attached to this document. In particular, the stepper unit exposure device shown in FIG. 1 includes a mask table 122 and a plate table 123 which are supported on a carriage 112. The carriage has a U-shaped cross-section. The mask and plate tables are supported opposite each other. A mask 113 and a plate 114 are respectively supported on tables 122 and 123. A mask-side reference mark plate 130 is fixed to the end of the mask table 122, and a plate-side reference mark plate 128 is fixed opposite to the mask-side reference mark plate 130. Movement of the carriage 112 in the direction of arrow A, causes mask 113 and plate 114 to be scanned by an illuminating system 117 and a projection optical system 118. A pattern is formed through mask 113 via illuminating light from illuminating system 117. To expose plate 114, the light that passes through mask 113 and which passes through projection optical system 118 becomes incident on plate 114. In FIG. 1, actuators 124a–124c control the position of the mask table during mask setup processes to ensure proper exposure.

The exposure device depicted in FIG. 1 is further illustrated in and discussed with regard to FIG. 2 which also is attached hereto. In particular, the projection optical system shown in FIG. 1 is made up of seven optical modules $125_1$–$125_7$. Each optical module 125 has a trapezoidal exposure field that divides the pattern on mask 113 to be copied/projected onto plate 114. Each optical module 125 has a mechanism 126 to adjust the position of the projected image. The trapezoidal regions $PA_1$–$PA_4$ are projected by optical modules $125_1$–$125_4$ while trapezoidal regions $PA_5$–$PA_7$ are projected by optical modules $125_5$–$125_7$.

The trapezoidal regions are aligned in a direction (non-scanning direction) perpendicular to the scanning direction at a predetermined spacing. The ends (those portions shown by dashed lines in FIG. 3, which is attached hereto) of adjacent trapezoidal regions (for example, $PA_1$ and $PA_5$, $PA_5$ and $PA_2$, etc.), and the optical modules $125_1$–$125_7$ are arranged such that they overlap by a predetermined amount in a non-scanning direction.

In mask-side reference mark plate 130, and in plate-side reference mark plate 128, as shown in FIG. 3, mask-side reference marks $M_1$–$M_8$, and plate-side reference marks $P_1$–$P_8$, are disposed such that the associated marks overlap. Such marks are located so as to correspond to the aforementioned overlap portions of the trapezoidal regions.

Calibration of the optical modules $125_1$–$125_7$ is illustrated with regard FIG. 4, which also is attached hereto. As shown in FIG. 4, mask-side reference marks $M_1$–$M_8$ are projected onto plate-side reference marks $P_1$–$P_8$ via optical modules $125_1$–$125_7$. Because reference marks $M_1$–$M_8$ and $P_1$–$P_8$ are formed and disposed to overlap, when the same do not overlap (e.g., because of device movement or drive anomalies, etc.), the optical modules are considered to be the cause of such an anomaly and any resultant distortion. Consequently, the relative positions of the marks $M_1$, $M_2$ projected by optical module $125_1$, and the plate-side reference marks $P_1$, $P_2$, are photoelectrically detected by use of a sensor 132 (e.g., a TV camera, etc.). In turn, positional displacement data $(dx_1, dy_1)$ between mark $P_1$ and the projected image of mark $M_1$, and positional displacement data $(dx_2, dy_2)$ between mark $P_2$ and the projected image of mark $M_2$ may be found and derived. With such displacement data (e.g., displacement measurement data, etc.), the particular adjustment mechanism 126 corresponding to optical module $125_1$ may be used to adjust optical module $125_1$ so that the respective positional displacement amounts become zero or tolerable.

Similarly, adjustment is performed relative to optical modules $125_2$–$125_7$ such that corresponding mask-side reference marks ($M_3$–$M_8$) and plate-side reference marks ($P_3$–$P_8$) overlap. Furthermore, the adjustment of the optical modules $125_5$, $125_6$, $125_7$ may be performed by moving carriage 112, so that the reference marks enter the exposure fields of the optical modules $125_5$, $125_6$, $125_7$. Accordingly, adjustment is possible so that the seven optical modules are able to project the pattern on mask 113 accurately and within expected tolerances.

Although, prior exposure devices allow calibration of projected images and, in particular, calibration of projection optical systems to effect accurately projected design patterns, such calibration is performed by using mask-side reference marks disposed on a special mask-side reference mark plate which may be independent of the mask that is to be imaged and plate-side reference marks disposed on a special plate-side reference mark plate. Thus, in the case where there is a positioning error (due to a mask pattern error as shown by the solid lines in FIG. 5, for example), the same cannot be corrected by prior exposure devices. That is, because prior exposure devices are centrally concerned with registration and calibration of reference marks, they do not adequately address the problems associated with design pattern errors that are often realized. As such, design patterns like those shown in FIG. 5 often have been erroneously projected and imaged onto a plate or substrate. And, in particular, the positional errors that can result (especially for large masks) can approach ±1 μm.

Thus, there exists a need to provide new and improved exposure devices and methods for making and using the same. Such devices must allow masks and reference marks to be integrally formed so that pattern and projection errors are minimized and avoided, and so that resultant exposures more accurately adhere to design requirements. To be viable, such devices and methods must allow projection exposures on substrates without realizing errors often associated with prior exposure devices.

SUMMARY OF THE INVENTION

The present invention has as its principal object to solve the aforementioned problems associated with prior image exposure devices by providing improved devices that deliver greater exposure accuracy and apparatus efficiency. Such improved devices will, in turn, allow manufacturers of liquid crystal display (LCD) panels, semiconductor elements, etc. to produce such components more accurately and reliably.

It is another object of the present invention to provide an exposure apparatus for use in a stepper unit that allows accurate imaging to be realized relative to a mask that may contain design pattern errors and the like.

It is still another object of the present invention to provide an exposure apparatus for use in a stepper unit that accommodates masks having integrally formed patterns and reference marks to facilitate accurate adjustment of corresponding projection optical systems.

It is a further object of the present invention to provide an exposure apparatus for use in a stepper unit that adjusts optical characteristics of imaging systems by utilizing reference marks that closely relate to attributes of a design pattern formed on a projection mask or reticle.

It is a further object of the present invention to provide an exposure apparatus that may be applied to many different types of stepper units including mirror-type units without causing significant increases in stepper size.

It is another object of the present invention to provide methods for making and using an exposure apparatus in accordance with the present invention.

By providing an exposure apparatus and related methods for making and using the same, certain benefits are realized. For example, an exposure apparatus according to the present invention will accommodate a mask or reticle that includes a design pattern which is integrally formed with related reference marks to be used to calibrate image exposure systems within a stepper unit. The present invention will allow masks (or reticles) to be used to reliably produce liquid crystal display (LCD) panels, for example, even when such masks contain design pattern errors and the like. And, an exposure apparatus according to the present invention will more accurately and efficiently respond to error conditions associated with design pattern errors and the like as automatic corrections may be made during exposure operations as opposed to realizing defective and unusable finished products. As such, more accurate imaging is made possible as reference marks formed on a mask allow an exposure apparatus according to the present invention to more closely respond to particularities of design patterns.

The present invention achieves the above-stated objects to deliver the aforementioned benefits by providing an exposure apparatus and methods for making and using the same. The exposure device includes at least one projection optical system that projects illuminating light, a substrate stage which supports a substrate to be exposed by the illuminating light and which includes a first plurality of reference marks. The exposure device also includes a mask stage which supports a mask including a mask pattern to be projected onto the substrate by at least one projection optical system. The mask further includes a second plurality of reference marks intended to correspond to the first plurality of reference marks. The second plurality of reference marks is integrally formed with the mask pattern. The projection optical system(s) project the illuminating light based on the mask pattern and the second plurality of reference marks to produce a projected image corresponding to the mask pattern and a plurality of projected images corresponding to the second plurality of reference marks. The exposure apparatus also includes an adjustment mechanism which adjusts the position of the projected image on the substrate based on a plurality of positional relationships between the plurality of projected images and the first plurality of reference marks. Also included is a plurality of sensors which detect the positional relationships, and a control device which controls the adjustment mechanism based on the positional relationships to effect a predetermined plurality of positional relationships between the plurality of projected images and the first plurality of reference marks.

According to another aspect of the present invention, provided is a method for making an exposure device. The method includes the steps of providing a projection optical system that is configured to project illuminating light, and providing a substrate stage that is configured to support a substrate to be exposed by said illuminating light. The substrate stage includes a first reference mark. The method further includes a step of providing a mask stage that is configured to support a mask including a mask pattern to be projected onto the substrate by the projection optical system. The mask further includes a second reference mark. The second reference mark is integrally formed with the mask pattern. The method further includes a step of configuring the projection optical system to project light to produce a projected image corresponding to the second reference mark. The projected image is to become incident on the substrate stage. The method also includes a step of providing an adjustment mechanism that is configured to adjust the position of the projected image on the substrate stage by adjusting the projection optical system based on a positional relationship between the projected image and the first reference mark. Finally, the method includes the steps of providing a sensor configured to detect the positional relationship, and providing a control device configured to control the adjustment mechanism based on the positional relationship to effect a predetermined positional relationship between the projected image and the first reference mark.

And, according to another aspect of the present invention, provided is a exposure method for exposing a mask pattern on a substrate via at least one projection optical system. The method includes the steps of arranging a first reference mark on a substrate stage that is configured to support a substrate to be exposed, and arranging a mask on a mask stage. The mask includes a design pattern and an integrally formed second reference mark. The method also includes steps of causing the first reference mark and the second reference mark to correspond, causing illuminating light to pass through the second reference mark to form a corresponding projected image on the substrate stage, determining a positional relationship between the projected image and the first reference mark, and adjusting the position of the projected image based on the positional relationship to effect a predetermined positional relationship between the projected image and the first reference mark. Finally, the method includes a step of exposing the substrate based on the mask pattern.

BRIEF DESCRIPTION OF THE DRAWING FIGURES

The present invention is described below with reference to the following drawing figures, of which:

DETAILED DESCRIPTION OF THE PREFERRED EMBODIMENTS

Figure 1:
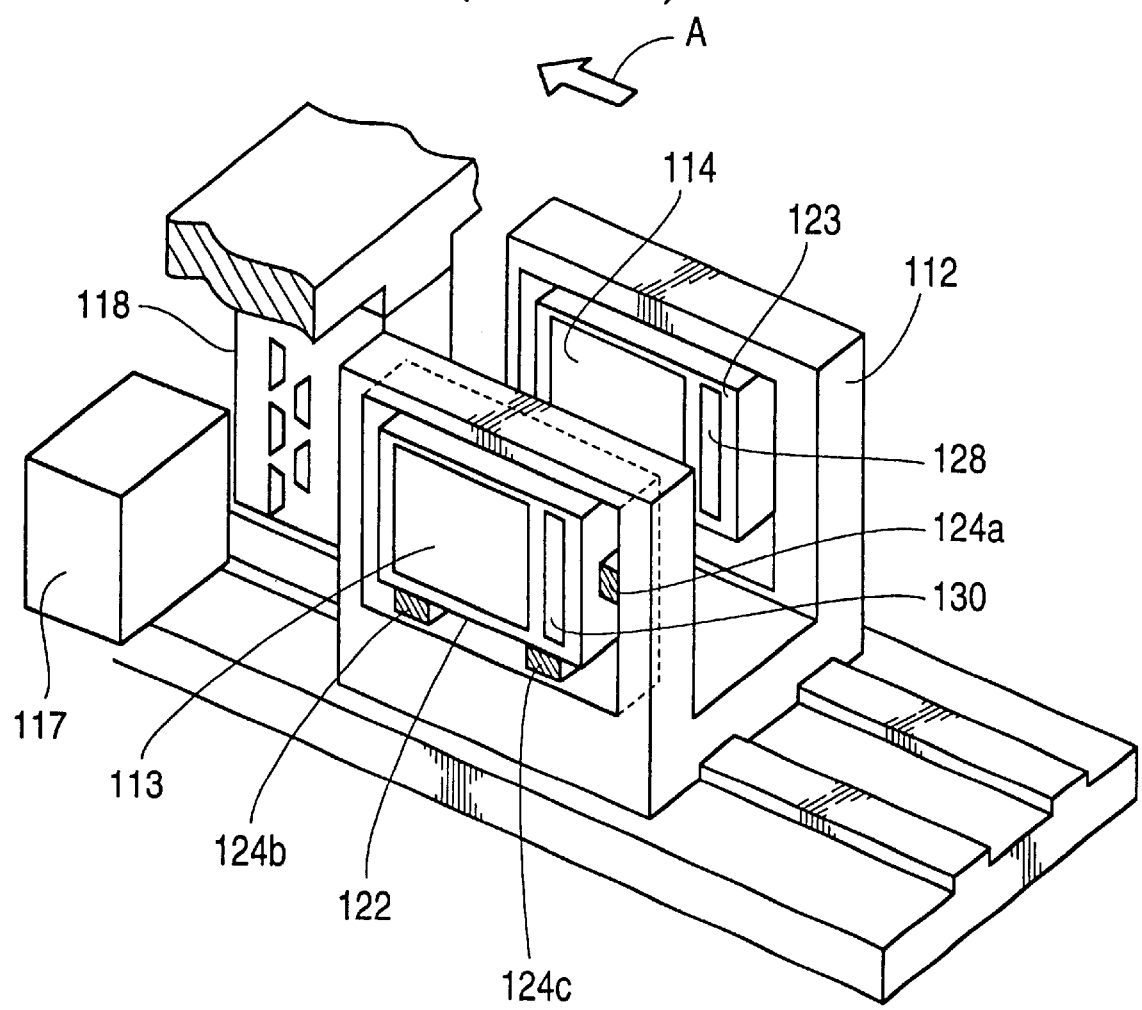
FIG. 1 is an oblique diagram of a scanning type exposure device according to the prior art.
Figure 2:
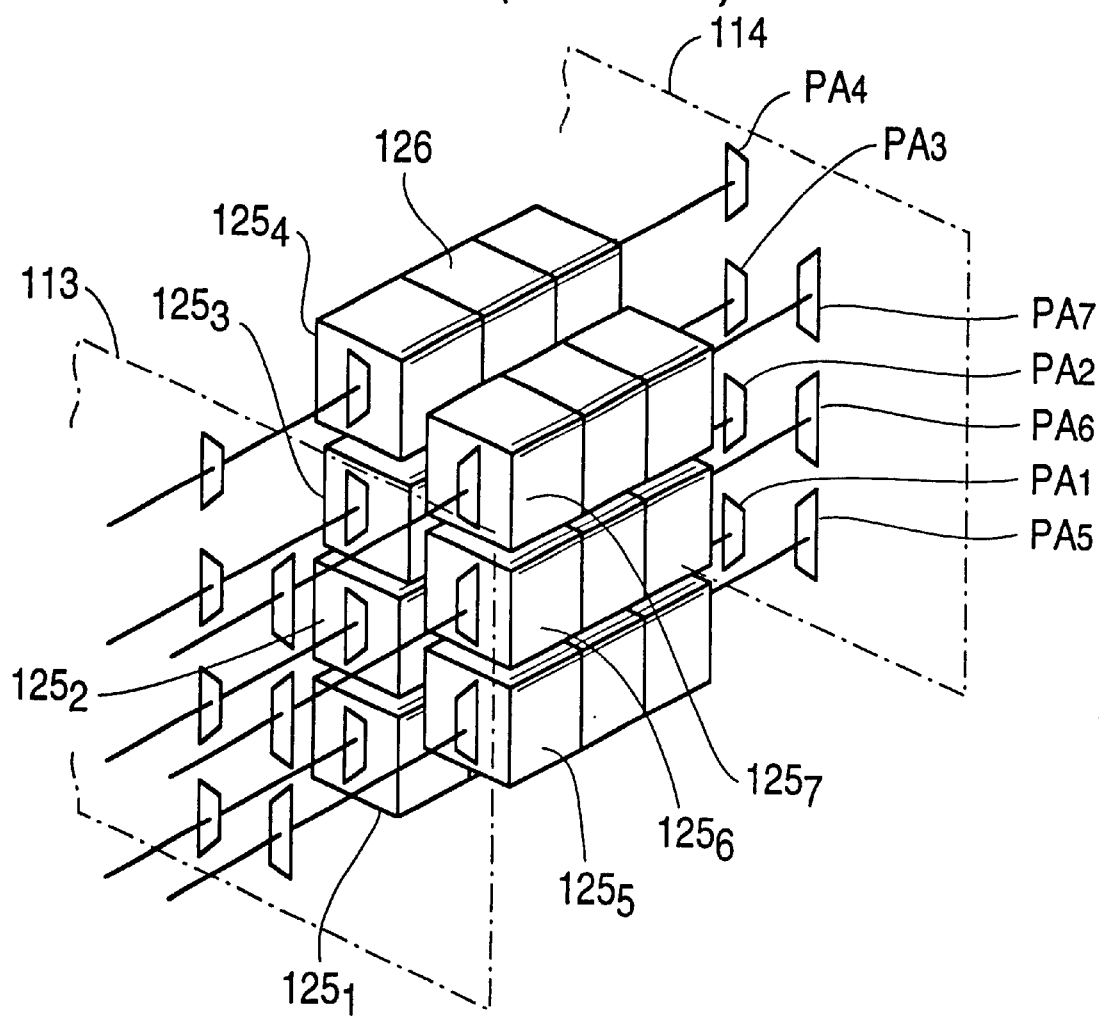
FIG. 2 is a diagram of the optical system modules of the exposure device shown in FIG. 1.

The present invention is now discussed with reference to the drawing figures that were briefly described above. Unless otherwise specified, like parts are referred to with like reference numerals. A description of the structures included and involved within the present invention is followed by a discussion of corresponding operations.

Figure 6:
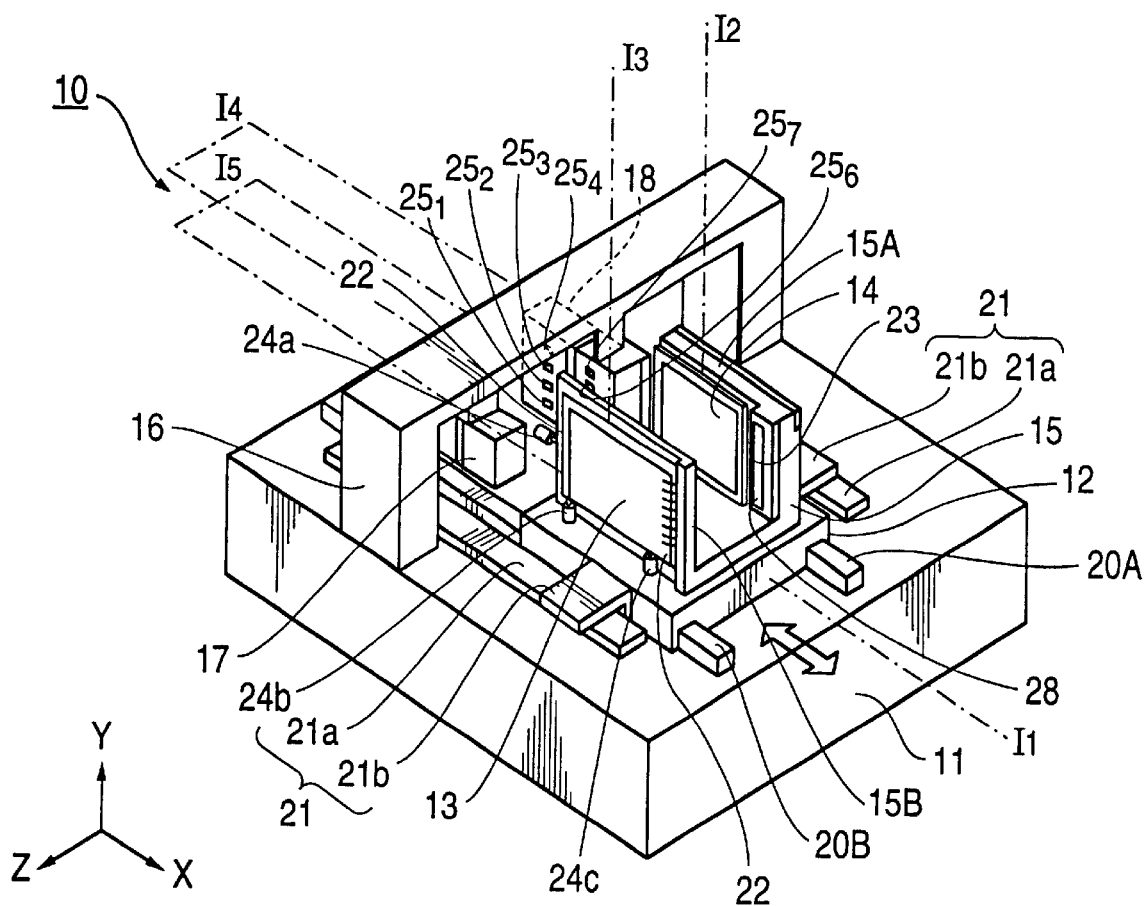
FIG. 6 is an oblique diagram of an exposure device according to a preferred embodiment of the present invention.

Referring now to FIG. 6, depicted therein is a diagram of an image exposure apparatus according to a preferred embodiment of the present invention. In particular, exposure apparatus 10 is a scanning type of exposure device that may be used to copy a circuit pattern which has been formed on a mask 13 onto a glass plate or other substrate such as during a manufacturing process related to production of an LCD display panel.

Exposure apparatus 10 is equipped with a base 11 and a moving stage 12 which is movable in an X-axis direction (i.e., in a scanning direction). Fixed on moving stage 12 is a carriage 15 (having a U-shaped cross-section). Carriage 15 supports mask 13 and plate 14. Additionally, carriage 15 supports an illumination optical system 17 disposed on a body member 16 which is arranged in the Z-axis direction. A projection optical system 18 also is supported by body member 16.

Moving stage 12 is supported on air bearings (not shown) in a floating arrangement on a pair of guide members 20A and 20B which extend in the X-axis direction. Moreover, a pair of moving magnet type linear motors 21 are disposed on both sides of moving stage 12. Moving stage 12 and carriage 15 are driven along guide members 20A and 20B by linear motors 21. Furthermore, linear motors 21 include magnet tracks 21a that extend in the X-axis direction. Coils 21b are used to operate linear motors 21 and are mounted on moving stage 12.

A plate stage 15A is disposed on carriage 15. Plate stage 15A supports a plate table 23, which further supports plate 14 in a vertical orientation (referred to herein as the XY plane). A mask stage 15B also is disposed on carriage 15. Mask table 22 supports mask 13 in the XY plane. Mask table 22 may be automatically positioned in the XY plane in accordance with the present invention through use of motors 24a–24c which allow adjustment in position and attitude relative to carriage 15.

The surface of plate stage 15A (facing mask stage 15B) is convex. Reference mark plate 28 is fixed to the convex surface of plate stage 15A. Moreover, the surface of plate-side reference mark plate 28 is set in practically the same plane as the surface of plate 14. Such stage surfaces will be understood by those skilled in the art.

In context of the present preferred embodiment, the length of mask 13 in the X-axis direction (scanning direction) is longer than plate 14. Accordingly, eight mask-side reference marks are integrally formed on mask 13, in the region opposite plate-side reference mark plate 28. Such eight reference marks are disposed at predetermined spacings in the Y-axis direction on mask 13. The use of such integrally formed mask-based reference marks is further discussed below with regard to FIG. 7.

The position of carriage 15 in axial directions X, Y, Z is measured by an interferometric system 30 (FIG. 9) that includes interferometers I1, I2, I3, I4, I5 (e.g., laser interferrometers, etc.).

Projection optical system block 18 is equipped with seven projection optical system modules $25_1$–$25_7$ (projection optical system module $25_5$ is not shown). Projection optical systems $25_1$–$25_7$ include respective trapezoidal exposure fields (FIG. 7) to produce multiple erect images that carefully make up an assembled image. Such projection systems will be readily apparent to those skilled in the art.

Figure 7:
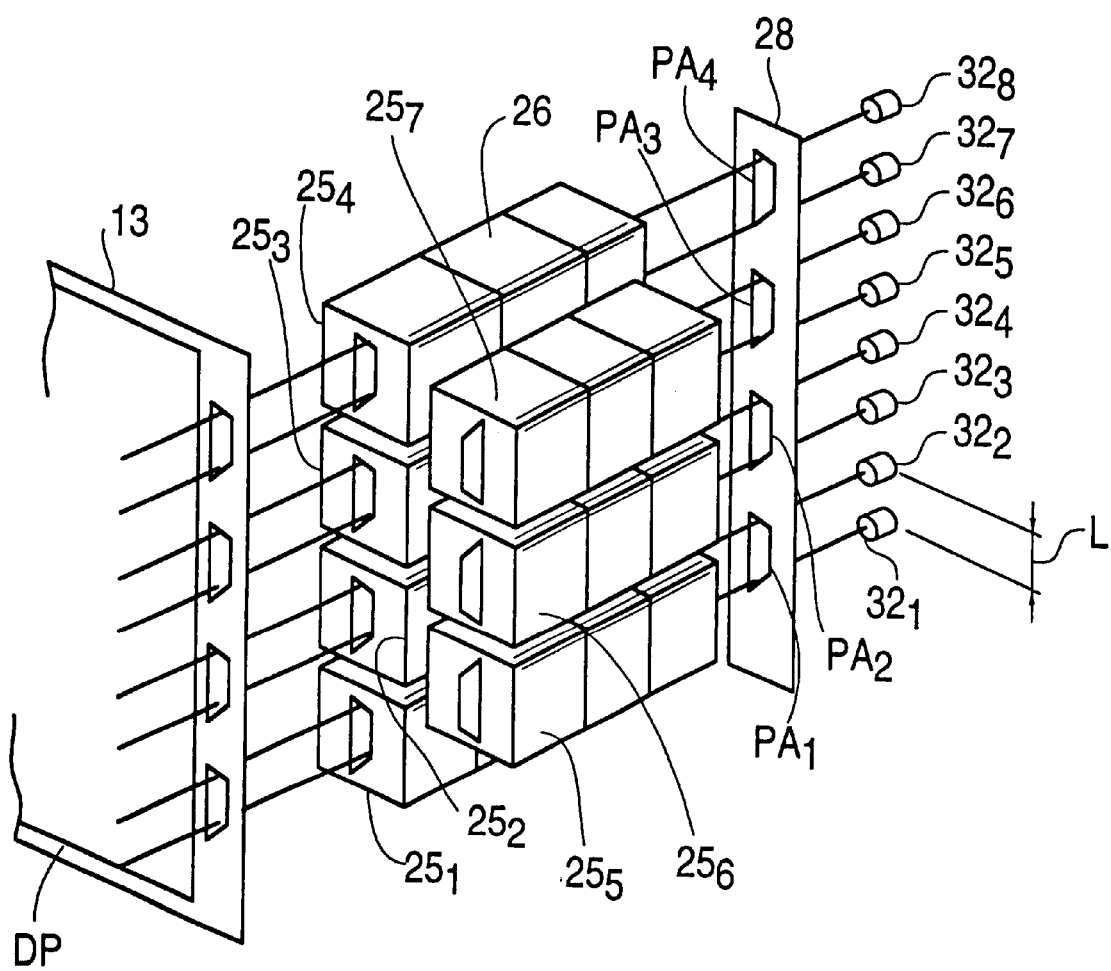
FIG. 7 is a diagram of the projection optical system modules depicted in FIG. 6.

Referring now to FIG. 7, the exemplary projection optical system modules $25_5$–$25_7$, are arranged in an assembly including projection optical system modules $25_1$–$25_4$. Moreover, the optical axis of the projection optical system module $25_5$ is arranged to lie between the optical axes of projection optical system module $25_1$ and projection optical system module $25_2$. The optical axis of projection optical system module $25_6$ is arranged to lie between the optical axes of projection optical system module $25_2$ and projection optical system module $25_3$. The optical axis of projection optical system module $25_7$ is arranged to lie between the optical axes of projection optical system module $25_3$ and projection optical system module $25_4$.

Figure 3:
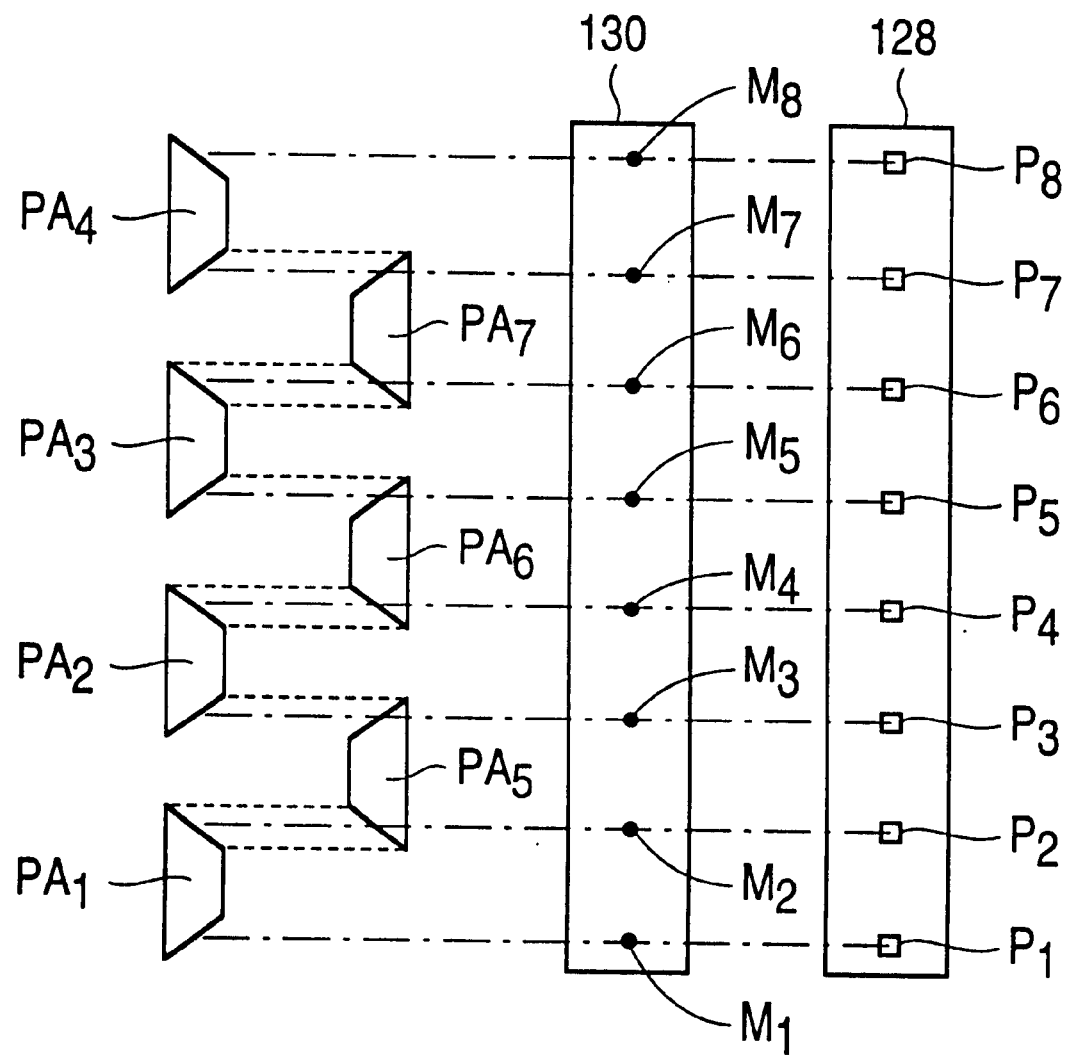
FIG. 3 is a diagram of a normal positional relationship between mask-side reference marks and corresponding plate-side reference marks relative to the device shown in FIG. 1.
Figure 4:
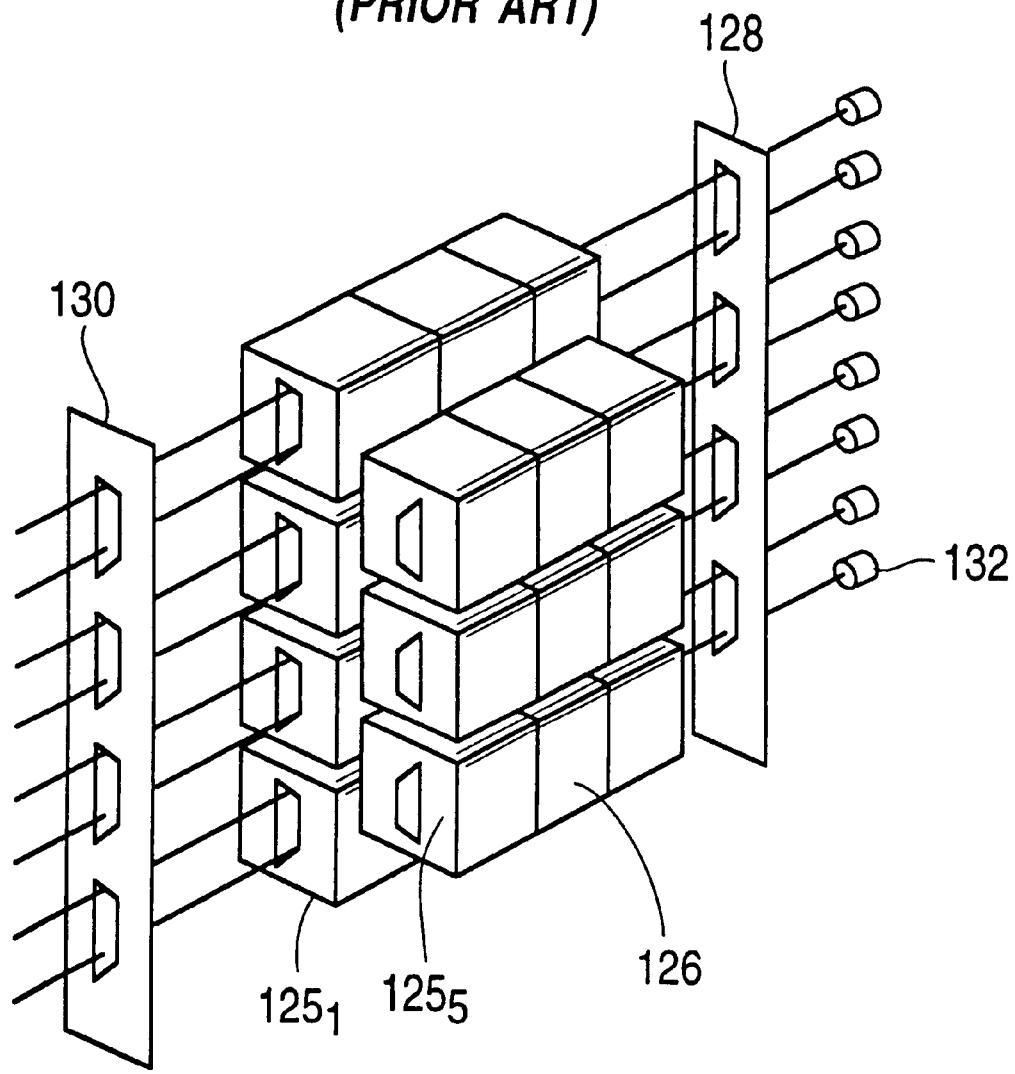
FIG. 4 is a diagram that illustrates calibration operations relative to the optical system modules of the device shown in FIG. 1.
Figure 5:
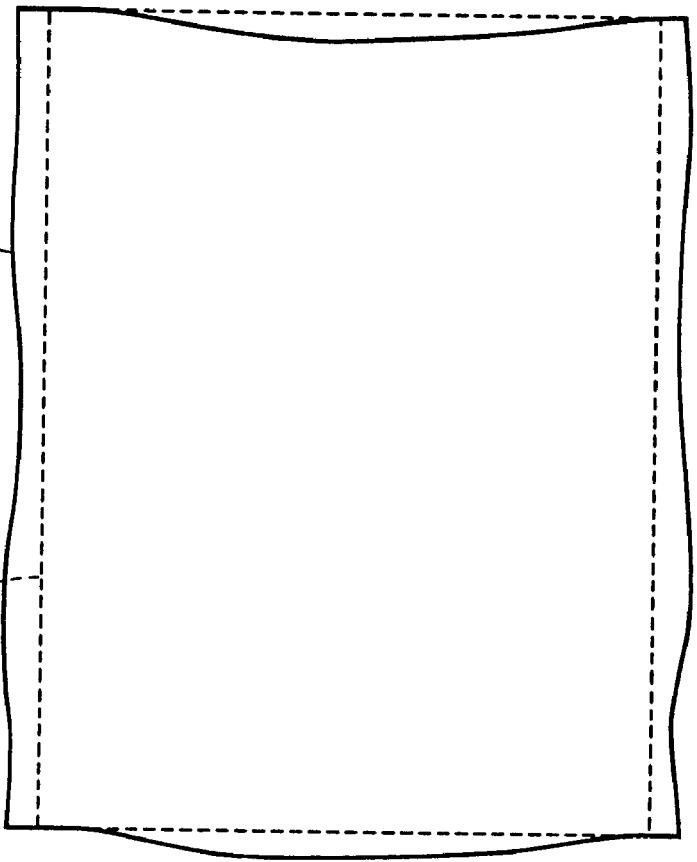
FIG. 5 is a diagram that illustrates an imaging problem not adequately addressed and solved by prior art exposure devices like or similar to one depicted in FIG. 1.

Accordingly, projection optical system modules $25_1$–$25_7$ are arranged in a zigzag state such that the trapezoidal projection regions $PA_1$–$PA_4$ of projection optical system modules $25_1$–$25_4$ and the trapezoidal projection regions $PA_5$–$PA_7$ of projection optical system modules $25_5$–$25_7$ (FIG. 3), overlap (at end portions thereof) by predetermined amounts in a Y-axis direction (i.e., a non-scanning direction). As such, exposures become possible by means of scanning mask 13 and plate 14 with respect to the projection optical system block 18. Accordingly, if mask 13 and plate 14 are scanned in a X-axis direction by driving stage 12 to move an entire pattern contained on mask 13 can be copied/projected onto plate 14 (e.g., in one or more scans). As such, in the present preferred embodiment, linear motors 21, moving stage 12, and carriage 15, cause substrate stage 15A and mask stage 15B to move simultaneously in the scanning direction.

In the present preferred embodiment, projection optical system modules $25_1$–$25_7$, and, in particular, optical characteristics thereof, are adjusted by adjusting mechanisms 26. As such, adjusting mechanisms 26 functions to adjust the position of projected images (copy images) onto plate 14. Accordingly, it is possible to adjust the positional displacement (shift), image rotation, magnification, etc. as optical characteristics associated with each projection optical system 25. For example, adjustment mechanisms 26 can adjust an image shift amount by causing a plane parallel to the interior (not shown) of a projection optical system module to rotate around respective X and Y axes. Additionally, adjustment mechanisms 26 can adjust magnification by driving one or more lenses within a projection optical system module along a respective optical axis. Also, adjustment mechanisms 26 can be configured to adjust rotation of images, etc. by rotating one or more prisms within the interior of a projection optical system module. Such adjustments to affect optical characteristics, for example, of projection optical system modules within the present invention are discussed below with regard to FIG. 8. Such adjustments may be accomplished by an adjustment mechanism similar or like a mechanism shown and described in U.S. Pat. No. 5,729,331. The material disclosed in U.S. Pat. No. 5,729,331 is incorporated herein by reference.

Figure 8:
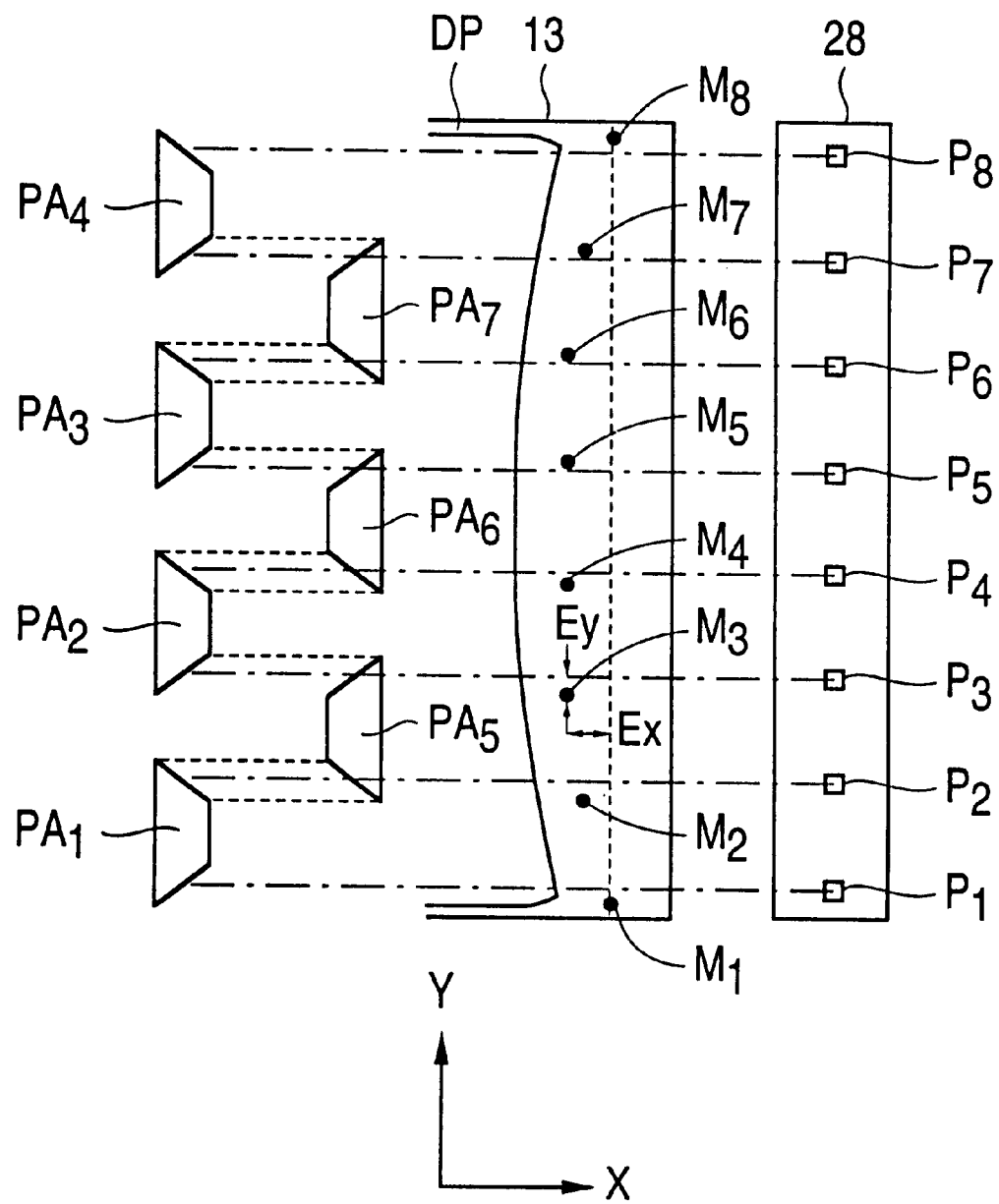
FIG. 8 is a diagram that illustrates trapezoidal exposure regions and positional relationships between mask-side reference marks and corresponding plate-side reference marks.

On reference mark plate 28 as shown in FIG. 8, for example, plate-side reference marks $P_2$–$P_7$ are disposed in positions corresponding to the overlap portions of mutually adjacent trapezoidal projection regions. Moreover, plate-side reference marks $P_1$, $P_8$ are disposed in positions which correspond to the inclined portions of trapezoidal projection regions $PA_1$ and $PA_4$.

In terms of mask 13, mask-side reference marks $M_1$–$M_8$ are integrally formed therewith and are intended to correspond to plate-side reference marks $P_1$–$P_8$. In the present preferred embodiment, mask-side reference marks $M_1$–$M_8$, are drawn/formed on mask 13 at the same time that design pattern DP is formed by a pattern generator such as one incorporating an electron beam exposure device, etc. In the event that drawing errors are realized during the mask generation process (such as those resulting from a device drive errors, etc.), errors, like those indicated by $E_x$, $E_y$, may and often result. The production of masks and reticles will be immediately understood by those skilled in the art.

As such, in the present preferred embodiment, sensors $32_1$–$32_8$ (e.g., TV video cameras, CCD devices, etc.) (FIG. 7) are included to photoelectrically detect the positions of plate-side reference marks $P_1$–$P_8$ relative to images of mask-side reference marks $M_1$–$M_8$ which are projected onto plate-side reference mark plate 28. The projection of mask-side reference mark images results from the projection of illuminating light by optical system modules $25_1$–$25_7$. Such sensors produce signals that correspond to data values that can be used to derive positional displacement and related distance measurement information. Sensors $32_1$–$32_8$ are disposed at the back of reference mark plate 28 (as shown in FIG. 7). Moreover, sensors $32_1$–$32_8$ may be disposed and supported within carriage 15.

The structures discussed above are coupled together in the exposure device of FIG. 6 and may be operated and controlled automatically through use of a processing unit like or similar to central processing unit. An exemplary arrangement is illustrated in FIG. 9.

Figure 9:
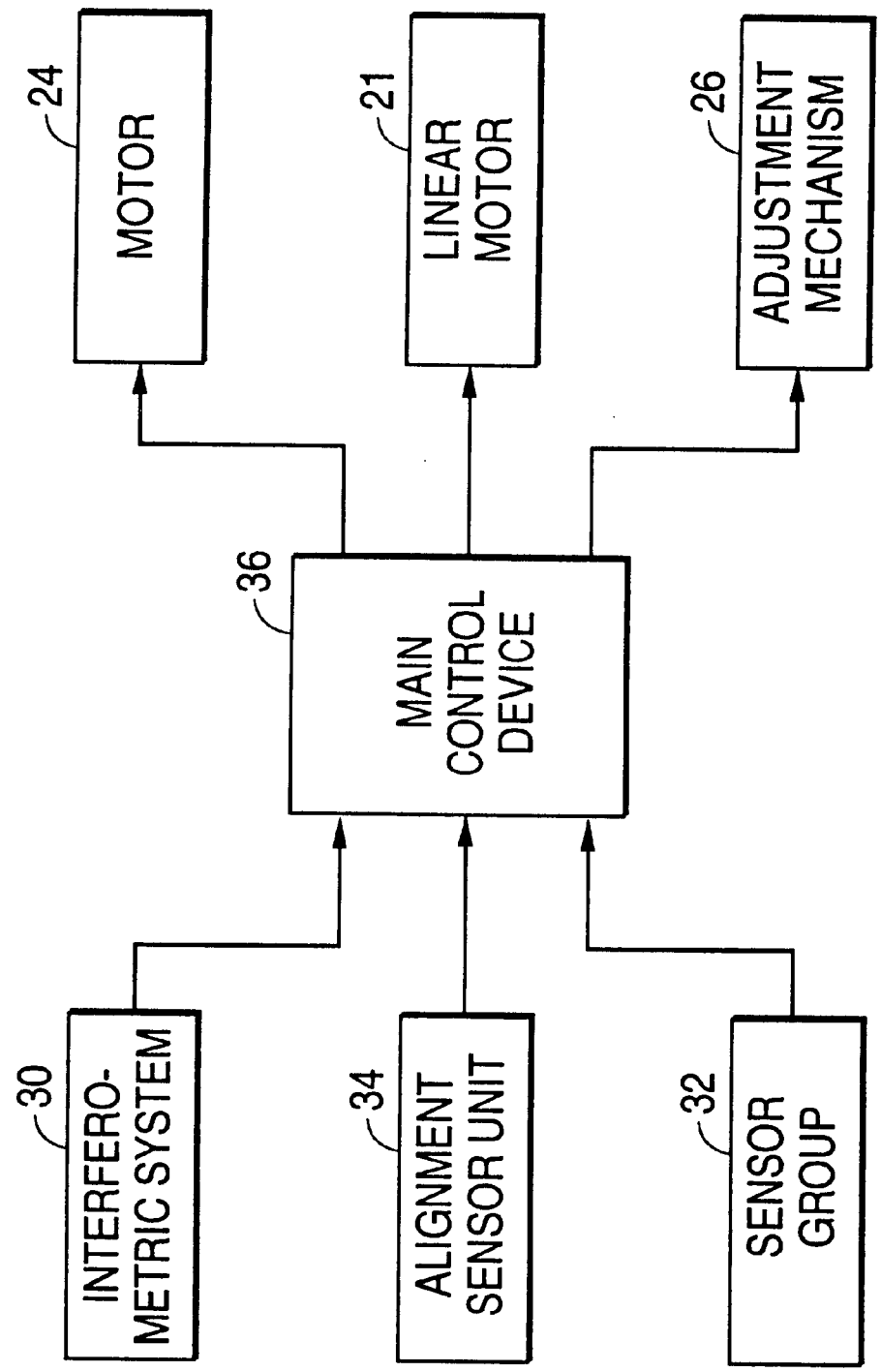
FIG. 9 is a block diagram of a preferred embodiment of a control system for the exposure device depicted in FIG. 6.

Referring now to FIG. 9, depicted therein is a block diagram of a control system that may be incorporated into exposure device 10 to control the same to correct for design pattern anomalies, etc. In particular, a main control device 36 (e.g., a microcomputer, minicomputer, etc.) is coupled to an interferometer system 30, an alignment sensor unit 34, a sensor group 32, motors 24, linear motors 21, and a control mechanism 26.

Interferometer system 30 includes interferometers I1, I2, I3, I4, I5 (e.g., laser interferometers, etc.) as shown in FIG. 6. Interferometer system 30 produces movement data in relation to two axial directions (e.g., X and Y directions) based on the movement of carriage 15, mask table 22, and plate table 23. Such movement data is detected by interferometers I1–I5 and, in turn, is provided to main control device 36 for appropriate processing as described below in regard to FIGS. 10A, 10B, 11A and 11B below.

Alignment sensor unit 34 includes a pair of alignment sensors such as imaging devices, (video cameras such as TV cameras, microscopes, etc.,) which are equipped with indexes set to desired detection standards. Such alignment sensors (.e.g., microscopes, etc.) may include sensors selected among sensors $32_1$–$32_8$. Accordingly, when carriage 12 is in a loading position (as shown in FIG. 6), a pair of reference marks for use in mask alignment (not shown) may be disposed on plate-side reference mark plate 28. A pair of reference marks $P_1-P_8$ may be used for such purposes. In any case, the pair of reference marks used for mask alignment are positioned (through carriage positioning, for example) so that the aforementioned indexes of the alignment imaging sensors (e.g., microscopes, etc.) correspond thereto. The position of the index of an alignment imaging device (e.g., registration marks of a microscope, etc.) relative to a respective alignment mark (not shown in the drawing) may be measured and calculated in accordance with the pixel pitch of the alignment imaging device (e.g., pixel pitch of a TV type camera, etc.) at particular magnifications, etc. When measurement values are obtained or otherwise derived, they are provided to main control device 36 for further processing.

Motors 24 include, for example, motors 24a–24c as shown in FIG. 6. Linear motors 21 include a pair of linear motors as shown in FIG. 6. Adjustment mechanism 26 includes adjustment mechanisms $26_1-26_7$.

It will be readily understood that the structures illustrated in FIGS. 6–9 are intended to be assembled and operatively arranged as indicated in FIG. 9. Accordingly, once the structures illustrated in FIGS. 6–9 are provided during an assembly and manufacturing process (e.g., a manual and automated assembly process), for example, a stepper unit including an exposure apparatus according to the present invention may be produced. That is, the present invention contemplates the manufacture of a stepper unit and/or particular exposure apparatus in which accurate imaging is realized through use of masks including integrally formed design patterns and mask reference marks. Because an exposure apparatus according to the present invention will accommodate a mask having a design pattern and reference marks formed proximately close thereto (e.g., reference marks that are formed on a mask in close relation to a design pattern), an accurate exposure of the mask will be possible even in the case that such a mask contains design pattern errors.

In operation, the structures shown in FIGS. 6–9 are used and calibrated to effectively expose images through mask 13 onto plate 14. Such operation is next described.

Motors 24a–24c are controlled by main control device 36 based on measurement values sensed or otherwise derived in accordance with the operation of alignment sensor unit 34. After motors 24a–24c are caused to operate, mask 13 will be aligned within mask stage 158 so that mask-side reference marks $M_1-M_8$ correspond to plate-side reference marks $P_1-P_8$. Correspondence of reference masks implies that mask-side reference marks $M_1-M_8$, for example, are in position to cause corresponding images thereof to be projected onto reference mark plate 28. Such correspondence may also cause one ore more mask-side reference marks to align with corresponding plate-side reference marks.

Measurement values (data) from interferometer system 30 are obtained and input to main control device 36. Such data will be used by main control device 36 to control a pair of linear motors 21 to cause carriage 15 to move until projection optical system modules $25_1-25_4$ are in a position opposite to plate-side reference mark plate 28. Such a state is shown in FIG. 7. In such a state, a shutter (not shown in the drawing) may be opened thereby allowing illuminating light from illuminating light source 17 to pass. Accordingly, when the four trapezoidal projection regions corresponding to the projection regions of the projection optical system modules $25_1-25_4$ are illuminated by illuminating light from illumination light source 17, main control device 36 uses sensors $32_1-32_8$ to measure or otherwise detect the relative positional relationships of the projected images of mask-side reference marks $M_1-M_8$ that are projected onto or near the plate-side reference marks $P_1-P_8$ on reference mark plate 28.

Accordingly, to calculate such positional relationships, main control device 36 may be programmed via computer software, etc. In particular, to obtain mathematical representations of the positional relationships, appropriate calculations are performed. To illustrate such calculations, the following discussion is directed to exemplary projection optical system module $25_1$, but may be based on measurements related to any other projection optical system modules within exposure device 10.

Figure 10B:
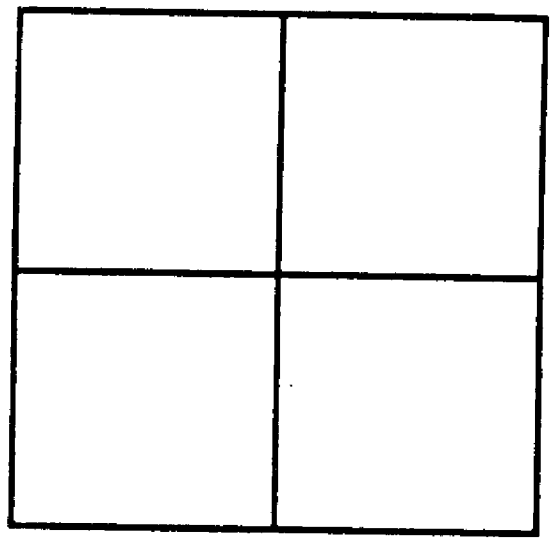
FIG. 10B is a diagram of a plate-side reference mark according to a preferred embodiment of the present invention.
Figure 10A:
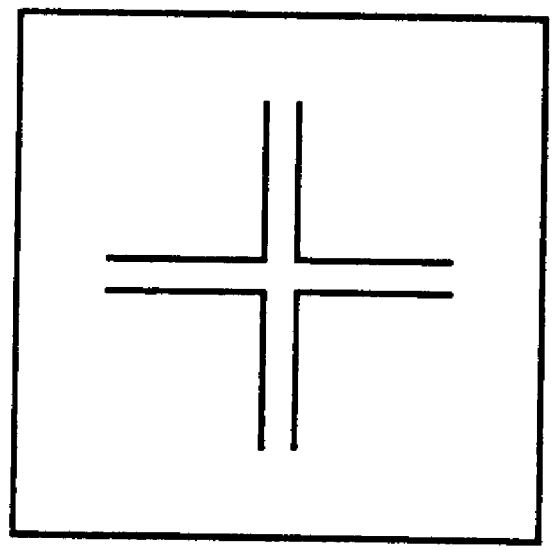
FIG. 10A is a diagram of a mask-side reference mark according to a preferred embodiment of the present invention.
Figure 11B:
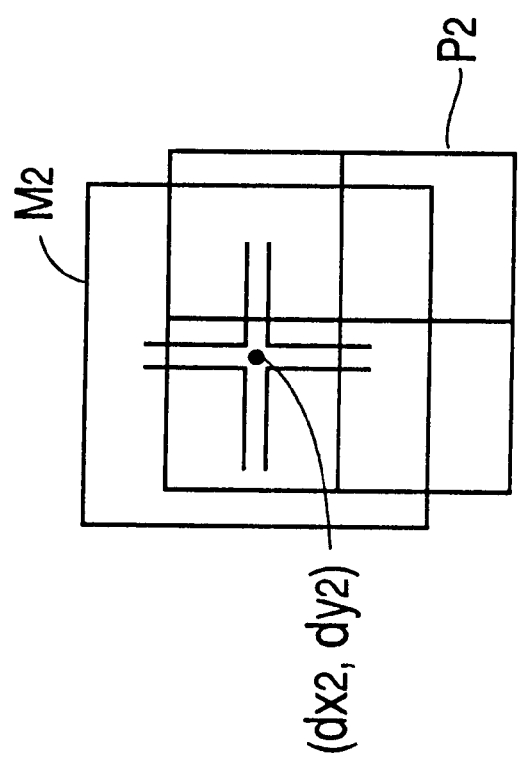
FIG. 11B is a diagram of an in image retrieved by a second sensor unit within the exposure device depicted in FIG. 6.
Figure 11A:
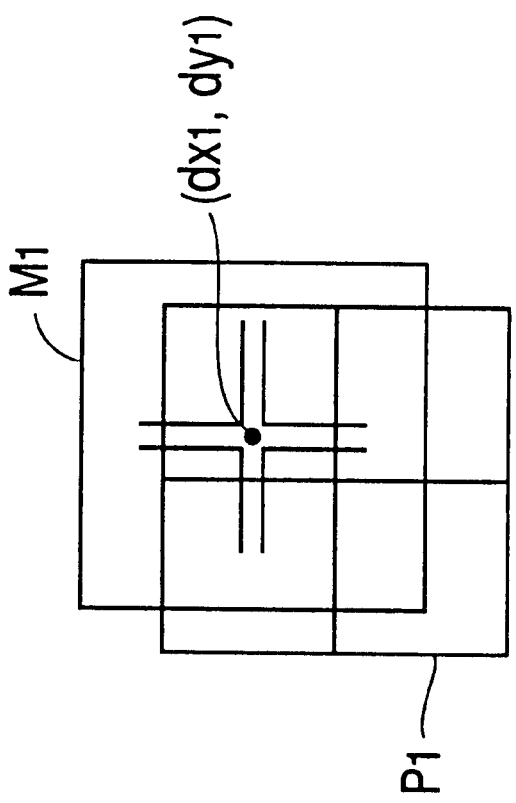
FIG. 11A is a diagram of an image retrieved by a first sensor unit within the exposure device depicted in FIG. 6.

To illustrate such calculations, a exemplary mask-side reference mark M is formed as a double-cross shaped mark as shown in FIG. 10A. A corresponding exemplary plate-side reference mark P is formed as a cross-hair shaped mark as shown in FIG. 10B. Images formed by a reference mark like mark M in two instances (identified as reference mark $M_1$ in FIG. 11A and as reference mark $M_2$ in FIG. 11B) are illustrated in FIGS. 11A and 11B, respectively. Accordingly, in FIGS. 11A and 11B, plate-side reference marks $P_1$ and $P_2$ correspond to reference marks $M_1$ and $M_2$, respectively.

When projected images of reference marks $M_1$ and $M_2$ as shown in FIGS. 11A and 11B are detected by sensors $32_1$, $32_2$, for example, relative position data (measurement values, etc.) may be derived. As such, with the center point of the plate-side reference marks $P_1$, $P_2$, set as origins, for example, appropriate measurement values may be derived as value pairs $(dx_1, dy_1)$ and $(dx_2, dy_2)$. The letter "d" is intended to indicate a distance value relative to a particular axis (e.g., "$dx_1$" indicates a distance value along an X-axis from a particular origin point). Such values may then be provided to main control device 36. Based on such measurement values, correction values for the projected images for projection optical system module $25_1$ may be calculated by main control unit 36 in accordance with the following equations (1)–(4):

Correction value of shift amount in an
X direction=$-(dx_1+dx_2)/2$ (1)

Correction value for shift amount in a
direction=$-(dy_1+dy_2)/2$ (2)

Correction value for magnification=$-(dy_2-dy_1)/L$ (3)

Correction value for rotation=$-(dx_1-dx_2)/L$ (4)

The negative sign (−) on the right-hand side of each equation (1)–(4) is applied because such results are correction values (intended to indicate corrective movement back to a registered or correct position). In equations (3) and (4), L is the distance between the measurement points (e.g., the distance between center points of reference marks $P_1$ and $P_2$) (as shown in FIG. 7).

Similarly, relative position data $(dx_3, dy_3)$, $(dx_4, dy_4)$ corresponding to mask-side reference marks $M_3$, $M_4$ relative to plate-side reference marks $P_3$, $P_4$ may be obtained via sensors $32_3$, $32_4$. Accordingly, the correction values of the projected images for projection optical system module $25_2$ may be calculated by main control device 36 based on equations (1)–(4).

Similarly, relative position data $(dx_5, dy_5)$, $(dx_6, dy_6)$ for mask-side reference marks $M_5$, $M_6$ relative to plate-side reference marks $P_5$, $P_6$ may be obtained via sensors $32_5$, $32_6$. Accordingly, the correction values of the projected images (copy images) for projection optical system module $25_3$ may be calculated by main control device 36 based on equations (1)–(4).

Additionally, relative position data $(dx_7, dy_8)$, $(dx_7, dy_8)$ for mask-side reference marks $M_7$, $M_8$ relative to plate-side reference marks $P_7$, $P_8$ may be obtained via sensors $32_7$, $32_8$. Accordingly, the correction values of the projected images (copy images) for projection optical system module $25_4$ may calculated by main control device 36 based on equations (1)–(4).

Accordingly, after calibration is achieved relative to projection optical systems $25_1$–$25_4$, as described above, additional, similar calibration techniques may be carried out to calibrate projection optical systems $25_5$–$25_7$. For example, after deriving the measurement values of interferometer system 30, main control device 36 may control linear motors 21 to causes carriage 15 to move in the X-axis direction (FIG. 6) until projection optical system modules $25_5$–$25_7$ reach a position opposite plate-side reference mark plate 28. After such movement, a shutter (not shown) may be closed. Accordingly, projection optical system modules $25_5$–$25_7$ will be positioned opposite mask-side reference marks $M_2$–$M_7$. In this state, the shutter (not shown in the drawing) may be re-opened a predetermined amount to illuminate respective trapezoidal projection regions corresponding to projection optical system modules $25_5$–$25_7$. Accordingly, the projected images of the mask-side reference marks $M_2$, $M_3$, $M_4$, $M_5$, $M_6$, $M_7$ will be projected onto plate-side reference marks $P_2$, $P_3$, $P_4$, $P_5$, $P_6$, $P_7$ by projection optical system modules $25_5$–$25_7$. Thereafter, main control device 36 measures the relative position of the plate-side reference marks $P_2$, $P_3$, $P_4$, $P_5$, $P_6$, $P_7$ which correspond to the projected images of the mask-side reference marks by using outputs of sensors $32_2$, $32_3$, $32_4$, $32_5$, $32_6$, $32_7$, respectively. Based on such measurement values output by sensors $32_2$, $32_3$, $32_4$, $32_5$, $32_6$, $32_7$, main control device 36 determines the correction values (shift, magnification, rotation, etc.) for the projected images of the projection optical system modules $25_5$–$25_7$ in accordance with equations (1)–(4) as described above.

After main control device 36 determines the aforementioned appropriate correction values, main control device 36 adjusts the imaging characteristics of the projection optical system modules $25_1$–$25_7$ via adjustment mechanisms 26 respectively disposed therefore. Accordingly, the imaging characteristics of the projection optical system modules $25_1$–$25_7$ are calibrated such that the eight reference marks $M_1$–$M_8$ formed on mask 13 are projected accurately onto plate-side reference marks $P_1$–$P_8$ and regardless of design pattern errors that exist on mask 13. As a result of such calibration, distortions of the projection optical system modules $25_1$–$25_7$ and/or drawing errors associated with the pattern on mask 13 may be corrected.

Figure 12:
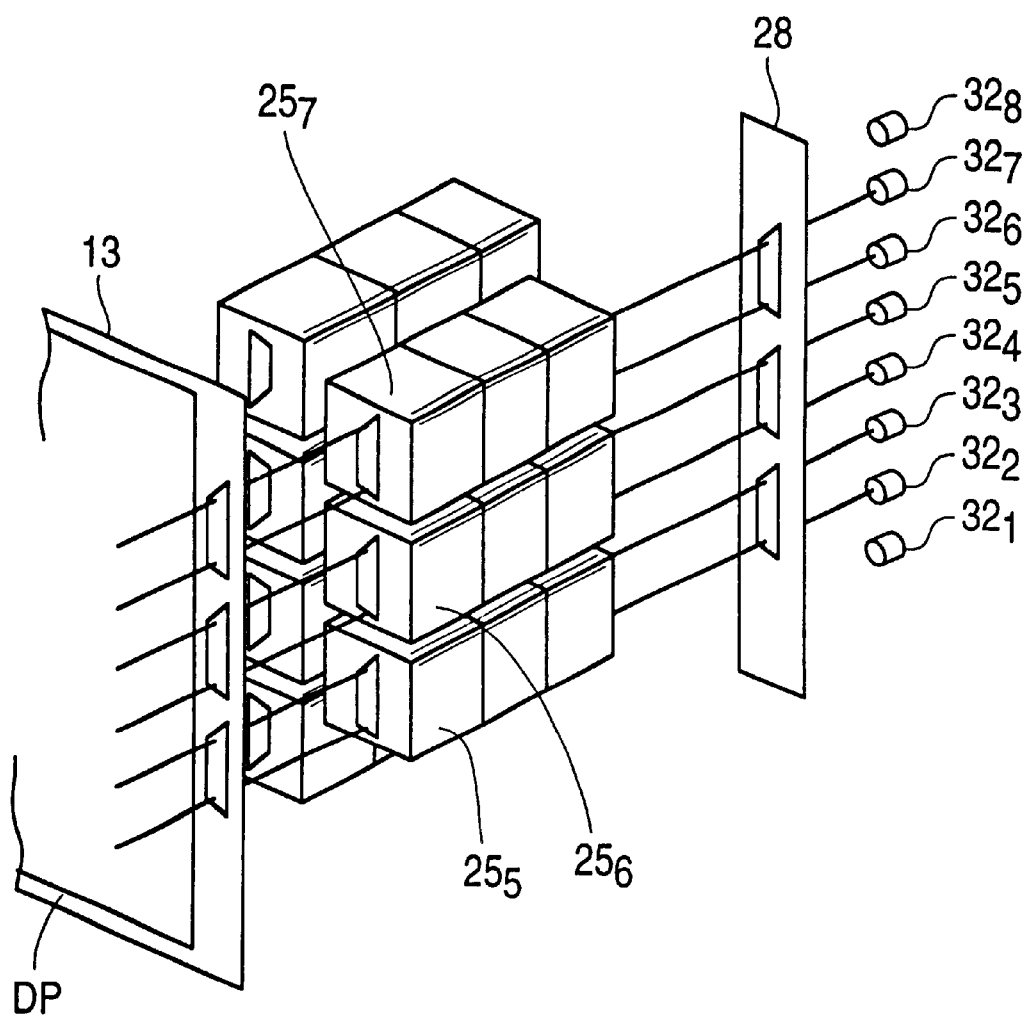
FIG. 12 is a diagram that illustrates the relative positions of plate-side/substrate marks used for calibration of the projection optical system modules within the exposure device depicted in FIG. 6.
Figure 13:
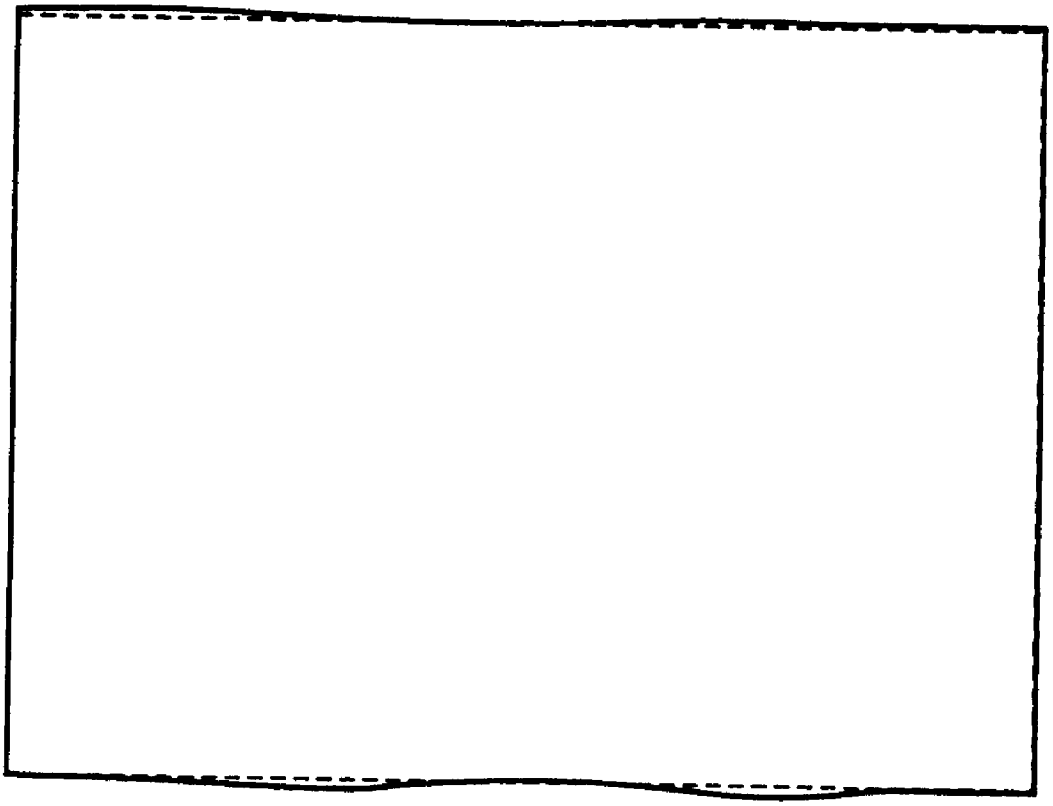
FIG. 13 is a diagram that illustrates exemplary results realized by an exposure device made in accordance with the present invention.

After calibration processes are performed as described above and after carriage 15 is caused to move to effect scanning at a predetermined speed along the X-axis illustrated in FIG. 6, for example, the pattern on mask 13 is copied/projected onto plate 14 by projection optical system modules $25_1$–$25_7$. Accordingly, the design pattern exposed on plate 14 is as shown by the solid line in FIG. 12. Drawing errors and the like in mask 13 have little to no effect on the imaging process and are minimized, if not totally negated, as illustrated by the dofted line in FIG. 13.

In the case of the above-described preferred embodiment of the present invention, projection optical system 18 includes seven projection optical system modules $25_1$–$25_7$ and a related number of reference marks. The present invention, however, is not so limited. To the contrary, any number of projection optical modules may be included and used. Additionally, any number of reference marks may utilized to suit particular design and calibration requirements.

Also, exemplary preferred embodiments of the present invention have been applied to a scanning type of exposure device in which the mask and plate (substrate) move as they are integrally supported by a carriage assembly. The present invention, of course, is not so limited. To the contrary, the present invention may be applied, to an exposure device of the type that include scanning projection optical systems, and to those that utilize static (non-moving) exposure projection systems.

Thus, having fully described the present invention by way of example with reference to the attached drawing figures, it will be readily appreciated that many changes and modifications may be made to the invention and to the embodiments shown and/or described herein without departing from the spirit or scope of the present invention which is defined in and covered by the appended claims.

What is claimed is:

1. An exposure apparatus which exposes a pattern of a mask onto a substrate, said apparatus comprising:

a plurality of projection optical systems disposed between said mask and said substrate to project said pattern onto said substrate;

a substrate stage which supports said substrate, said substrate stage including a first plurality of reference marks;

a mask stage which supports said mask including a second plurality of reference marks which is integrally formed with said mask pattern, said mask stage positioning said mask such that images of said second plurality reference marks projected by at least one of said projection optical systems correspond to said first plurality reference marks;

a plurality of sensors which detect a positional relationship between said images of said second plurality reference marks and said first plurality reference marks; and an adjustment system connected to said plurality of sensors to adjust at least one of said plurality of projection optical systems in accordance with said positional relationships, said adjustment system adjusting an imaging error including an error of said mask and an error of at least one of said projection optical system.

2. The exposure device according to claim 1, wherein said second plurality of reference marks is arranged to correspond to said mask pattern.

3. The exposure apparatus according to claim 1, wherein said adjustment system further comprises a plurality of motors which move said mask based on said predetermined plurality of positional relationships.

4. The exposure apparatus according to claim 1, wherein said adjustment system further comprises a plurality of motors which move said mask stage together based on said predetermined plurality of positional relationships.

5. The exposure apparatus according to claim 1, wherein said adjustment system further includes at least one adjustment device corresponding to said at least one projection optical system, said at least adjustment device adjusting the position of a particular one of said plurality of projected images by adjusting said corresponding at least one projection optical system.

6. The exposure apparatus according to claim 1, wherein said plurality of sensors includes a pair of alignment microscopes, each alignment microscope including an alignment reference mark, each alignment microscope determining an alignment positional relationship between a corresponding alignment reference mark and a corresponding first reference mark from said plurality of reference marks, said adjustment system adjusting said at least one projection optical system based on said alignment positional relationship.

7. The exposure device according to claim 1, wherein said mask stage and said substrate stage are arranged to move in a predetermined direction to facilitate scanning of said mask to expose said substrate.

8. The exposure apparatus according to claim 1, wherein said projection optical systems include at least two projection optical units arranged at a predetermined spacing along a scanning direction, and such that a first projection region corresponding to a first projection optical unit and a second projection region corresponding to a second projection optical unit partially overlap in a direction orthogonal to said scanning direction, said plurality of sensors being arranged at predetermined spacing in said direction orthogonal to said scanning direction.

9. The exposure apparatus according to claim 6, wherein said second reference mark is arranged to correspond to said mask pattern.

10. The exposure apparatus according to claim 6, wherein said mask stage and said substrate stage are arranged to move together in a predetermined direction to facilitate scanning of said mask to expose said substrate.

11. An exposure apparatus which exposes a pattern of a mask onto a substrate, said apparatus comprising:
a plurality of projection optical systems disposed between said mask and said substrate to project said pattern onto said substrate;
a substrate which supports said substrate and which includes a first reference marks;
a mask stage which supports said mask including a second reference mark which is integrally formed said pattern, said mask stage positioning said mask such that an image of said second reference mark projected by at least one of said projection optical systems corresponds to said first reference mark;
a sensor which detects a positional relationship between said image of said second reference mark and said first reference mark; and
an adjustment system connected to said sensor to adjust at least one of said projection optical systems in accordance with said positional relationship, said adjustment system adjusting an imaging error including an error of said mask and an error of at least one of said projection optical system.

12. The exposure apparatus according to claim 11, wherein said adjustment system further comprises a plurality of motors which move said mask based on said positional relationship.

13. The exposure apparatus according to claim 11, wherein said projection optical systems project the pattern onto the substrate such that portions of the pattern overlap each other.

14. The exposure apparatus according to claim 11, wherein a projection area of said projection optical systems has a rectangular shape.

15. An exposure apparatus, comprising:
at least one projection optical system which projects illuminating light;
a substrate stage which supports a substrate to be exposed by said illuminating light, said substrate stage including a first plurality of reference marks;
a mask stage which supports a mask including a mask pattern to be projected onto said substrate by said at least one projection optical system, said mask further including a second plurality of reference marks corresponding to said first plurality of reference marks, said second plurality of reference marks is arranged in relation to said mask pattern;
said at least one projection optical system projecting said illuminating light based on said mask pattern and said second plurality of reference marks to produce a projected image corresponding to said mask pattern and a plurality of projected images corresponding to said second plurality of reference marks;
an adjustment mechanism which adjusts a position of said projected image on said substrate based on a plurality of positional relationships between said plurality of projected images and said first plurality of reference marks, said adjustment mechanism further including a plurality of motors which move said mask based on said predetermined plurality of positional relationships and which move said substrate stage and said mask stage together based on said predetermined plurality of positional relationships, and at least one adjustment device corresponding to said at least one projection optical system, said at least one adjustment device adjusting the position of a particular one of said plurality of projected images by adjusting said corresponding at least one projection optical system;
a plurality of sensors which detect said positional relationships, said plurality of sensors includes a pair of alignment microscopes, each alignment microscope including an alignment reference mark, each alignment microscope determining an alignment positional relationship between a corresponding alignment reference mark and a corresponding first reference mark from said plurality of reference marks, said adjustment mechanism adjusting said at least one projection optical system based on said alignment positional relationship; and
a controller which controls said adjustment mechanism based on said positional relationships to effect a predetermined plurality of positional relationships between said plurality of projected images and said first plurality of reference marks.

16. An exposure apparatus which exposes a pattern of a mask onto a substrate while said mask and said substrate move in a scanning direction, the apparatus comprising:
a projection optical system disposed between said mask and said substrate to project said pattern onto said substrate;
a substrate stage which supports and substrate and which includes a first reference mark;
a mask stage which supports said mask including a second reference marks, which are arranged in a direction orthogonal to said scanning direction with a predetermined interval, said mask stage positioning said mask such that at least one of image of said second reference marks projected by said projection optical system corresponds to said first reference mark;
a sensor which detects a positional relationship between said at least one image of said second reference marks and said first reference mark; and an adjustment system connected to said sensor to adjust said projection optical system in accordance with said positional relationship, and adjustment system adjusting an image error including an error of said mask and an error of said projection optical system.

17. The exposure apparatus according to claim 16, wherein a magnification of said projection optical system is substantially equal to one.

18. The exposure apparatus according to claim 16, wherein a projection area of said projection optical system has a rectangular shape.

19. The exposure apparatus according to claim 16, wherein said substrate stage is driven by a linear motor.

20. The exposure apparatus according to claim 16, wherein said adjustment system comprises an optical member.

21. The exposure apparatus according to claim 20, wherein said optical member is a prism.

22. The exposure apparatus according to claim 16, wherein said sensor is mounted on said substrate stage.

* * * * *